United States Patent
Ahmad

(10) Patent No.: US 12,142,749 B1
(45) Date of Patent: Nov. 12, 2024

(54) HEAT ACTIVATED MULTIPHASE FLUID-OPERATED PUMP FOR MOTOR TEMPERATURE CONTROL

(71) Applicant: HAMFOP Technologies LLC, Sacramento, CA (US)

(72) Inventor: Mudasir Ahmad, San Jose, CA (US)

(73) Assignee: Hamfop Technologies LLC, Sacramento, CA (US)

( * ) Notice: Subject to any disclaimer, the term of this patent is extended or adjusted under 35 U.S.C. 154(b) by 0 days.

(21) Appl. No.: 18/537,775

(22) Filed: Dec. 12, 2023

Related U.S. Application Data

(62) Division of application No. 17/471,636, filed on Sep. 10, 2021, now Pat. No. 11,990,598.

(51) Int. Cl.
| | |
|---|---|
| *H01M 10/6569* | (2014.01) |
| *H01M 10/613* | (2014.01) |
| *H01M 10/625* | (2014.01) |
| *H01M 10/6557* | (2014.01) |
| *H02K 9/14* | (2006.01) |
| *H02K 9/19* | (2006.01) |

(52) U.S. Cl.
CPC ..... *H01M 10/6569* (2015.04); *H01M 10/613* (2015.04); *H01M 10/625* (2015.04); *H01M 10/6557* (2015.04); *H02K 9/14* (2013.01); *H02K 9/19* (2013.01); *H01M 2220/20* (2013.01)

(58) Field of Classification Search
CPC ........... H01M 10/6569; H01M 10/613; H01M 10/625; H01M 10/6557; H01M 2220/20; H02K 9/14; H02K 9/19
See application file for complete search history.

(56) References Cited

U.S. PATENT DOCUMENTS

| | | | | |
|---|---|---|---|---|
| 1,781,541 | A * | 11/1930 | Einstein | C09K 5/047 62/110 |
| 2,927,434 | A * | 3/1960 | MacCracken | F04F 1/04 60/677 |
| 5,129,788 | A * | 7/1992 | Okayasu | F04F 1/04 417/409 |
| 6,042,342 | A * | 3/2000 | Orian | F04F 1/06 417/208 |

(Continued)

*Primary Examiner* — Raheena R Malik
(74) *Attorney, Agent, or Firm* — Mark Protsik; Thomas Schneck

(57) ABSTRACT

A heat-activated pump regulates the temperature of a battery or motor. For a battery, an evaporator has fluid passageways arranged in a serpentine path or multiple parallel paths, in direct contact with battery cells. For a motor, the passageways wrap around its casing or within. Working fluid in the passageways is converted to vapor. Whenever a target pressure is exceeded, a pressure-control valve allows vaporized working fluid to escape into a liquid-piston chamber, where it expands adiabatically and displaces pumped liquid, expelling it in a pumping stage from the liquid-piston chamber through a check valve into a condenser. Another check valve allows the pumped liquid to return in a suction stage to the chamber. An injector valve between the liquid-piston chamber and the evaporator returns jets of condensed working fluid to the evaporator in successive brief spurts responsive to periodic pressure pulses in the liquid-piston chamber.

7 Claims, 5 Drawing Sheets

(56) References Cited

U.S. PATENT DOCUMENTS

| | | | | |
|---|---|---|---|---|
| 7,263,848 | B2* | 9/2007 | Bhatti | F25B 13/00 62/238.7 |
| 7,380,584 | B2* | 6/2008 | Ippoushi | F28D 15/0266 165/104.24 |
| 7,503,176 | B2* | 3/2009 | Yatsuzuka | F01K 9/02 60/659 |
| 7,971,449 | B2* | 7/2011 | Peterson | F01K 25/08 62/324.1 |
| 8,419,378 | B2* | 4/2013 | Fenton | F04F 5/14 417/187 |
| 8,758,924 | B2* | 6/2014 | Tennessen | B60L 50/64 429/120 |
| 8,820,114 | B2* | 9/2014 | Charamko | F25B 1/06 62/500 |
| 9,239,063 | B2* | 1/2016 | Fenton | F04F 5/14 |
| 9,689,624 | B2* | 6/2017 | Timmons | B60L 58/18 |
| 9,829,253 | B2* | 11/2017 | Mishkinis | F28D 15/0266 |
| 9,869,274 | B2* | 1/2018 | Fuhrman | F01K 27/005 |
| 10,041,708 | B2* | 8/2018 | Sedlak | H05K 7/20 |
| 10,436,521 | B2* | 10/2019 | Cho | F25B 49/02 |
| 10,471,841 | B2* | 11/2019 | Choufany | B60L 58/26 |
| 10,605,501 | B2* | 3/2020 | Bangheri | F25B 15/04 |
| 10,634,402 | B2* | 4/2020 | Kim | B60H 1/00385 |
| 10,712,100 | B2* | 7/2020 | Adamson | F28D 15/04 |
| 10,746,481 | B2* | 8/2020 | Bry | F28D 20/023 |
| 10,792,972 | B2* | 10/2020 | Sinkular | B60H 1/06 |
| 10,811,737 | B2* | 10/2020 | Palanchon | H01M 10/613 |
| 10,830,503 | B2* | 11/2020 | Kopko | F25B 5/02 |
| 10,914,266 | B2* | 2/2021 | Rolandson | F01K 15/02 |
| 10,962,304 | B2* | 3/2021 | Adamson | F28D 15/0266 |
| 11,279,258 | B1* | 3/2022 | Cohan | H01M 10/6561 |
| 11,737,240 | B1* | 8/2023 | Ahmad | H01M 10/6569 361/700 |
| 11,874,022 | B1* | 1/2024 | Ahmad | H05K 7/20827 |
| 11,898,578 | B1* | 2/2024 | Ahmad | H05K 7/20809 |
| 11,990,598 | B1* | 5/2024 | Ahmad | H01M 10/613 |
| 2009/0129946 | A1* | 5/2009 | Toubia | F04B 15/08 417/208 |
| 2011/0212356 | A1* | 9/2011 | Tennessen | H01M 10/6567 429/120 |
| 2017/0051980 | A1* | 2/2017 | Singh | F28D 1/05366 |

\* cited by examiner

HEAT ACTIVATED MULTIPHASE FLUID-OPERATED PUMP FOR MOTOR TEMPERATURE CONTROL

CROSS-REFERENCE TO RELATED APPLICATION

The present application is a divisional of U.S. patent application Ser. No. 17/471,636 filed on Sep. 10, 2021, which claims priority under 35 U.S.C. 119(e) from U.S. Provisional Application 63/076,546, filed Sep. 10, 2020.

TECHNICAL FIELD

The present invention relates to fluid-operated heat activated pumping devices for the transport of heat, and especially those adapted for heating and cooling of electric motors.

BACKGROUND ART

Electric vehicles and motorized transport in general (e-bikes, motorcycles etc.) are becoming more prevalent and are expected to further grow in usage as consumers become more environmentally conscious. Battery driven cars are known to have higher efficiency and lower maintenance costs due to fewer components compared to cars with internal combustion engines. Due to their improving efficiency and environmental benefits, batteries are also being used more commonly as backup power sources in industrial, datacenter and residential backup power applications. A key challenge with the proliferation of battery technology is efficiency and operating life, which are both strongly dependent upon the temperature at which the batteries are maintained. Reducing the operating temperature variation and lowering operating temperature are imperative to maintain battery efficiency and operating life.

The current techniques for maintaining electric car or motorized transport batteries at constant temperature include:

1. Air Cooling: Batteries are cooled by air flowing at high velocity over finned surfaces to remove the heat by convective heat transfer. Although a tried and tested technique, it is limited in its ability to cool batteries beyond a certain wattage level. Moreover, the size of the airflow heat transfer area needs to be large enough to be effective. The large area needed can be impractical for very long-range battery performance life in weight or space limiting applications like cars.

2. Refrigerant cooling with AC pump compressor: In cars, trucks, etc., the air conditioning system is coupled to the battery pack with pipes that conduct the refrigerant around the battery pack to keep it cool. The AC compressor keeps the battery packs cool in the same manner that it keeps the passenger compartment cool. This approach is extremely effective in terms of thermal performance. It also allows for easy replacement of battery packs, if needed. And, since it relies upon an existing AC compressor, no additional pump is used, saving space, weight, and efficiency. However, if the AC compressor fails, the battery pack will also suffer, since there is no redundancy. Also, to accommodate the additional constant cooling of battery packs, the size of the AC compressor needs to be made larger.

3. Water/Glycol Cooling: This technique involves using a water/glycol liquid mixture flowing in close contact with the battery packs to remove heat to a heat exchanger. A pump continuously moves the mixture to keep the battery packs at a target temperature. The performance of this cooling system depends on the pump.

There are several drawbacks of the existing pumps used in both refrigerant and water/glycol battery cooling systems. They have an electrical motor and several moving parts, which leads to early wear out and high operating costs. They are bulky and add weight to the car, bus or truck, which leads to lower efficiency and performance, especially if redundant pumps are used. The pumps themselves can produce heat, which needs to be removed efficiently as well. And they consume electrical power from the battery pack itself, thereby contributing to early battery discharge and lower range.

In addition to needing cooling, battery packs may also need to be heated in cold conditions to generate enough electrical output.

In heating mode, the electric motor is sometimes "stalled" to generate heat and the system's water/glycol flow is reversed to heat the batteries when the ambient temperature is too low for the batteries to operate efficiently.

Electric motors in general can withstand higher operating temperatures than batteries but require temperature control as well. As with batteries, electric motors can be air cooled or liquid cooled for higher performance, more compact use conditions. Liquid cooled motors involve the cooling liquid (typically water or water/glycol mixture) flowing around and/or through the motor to maintain the target temperature. The cooling fluid is actively circulated around the motor with the help of a mechanical pumping mechanism. The pumping mechanism could be a separate pump running in an open loop or in a closed loop where the liquid is constantly recirculated between the motor and a heat exchanger. There are several drawbacks of this approach: (1) the pump could fail, causing the motor to overheat, (2) the additional weight and size of the pump could increase the overall weight and size of the motor (3) the flowrate may need to be actively controlled to ensure the temperature of the motor is maintained within a set range regardless of duty cycles or ambient temperature, (4) the pump could be expensive, thus increasing the overall cost of the motor.

SUMMARY DISCLOSURE

A heat-activated pump is provided for temperature regulation of a motor, such as an electric motor in a motor casing. One or more fluid passageways collectively form an evaporator in thermal contact with heat generating elements of the motor, the passageways containing a working fluid and receptive of heat from the motor to convert the working fluid into vapor. For example, the fluid passageways might either comprise flexible tubing surrounding a motor casing or be integrated into the motor casing.

A pressure-control valve is coupled to an exit port of the fluid passageways of the evaporator. This pressure-control valve maintains the working fluid in the evaporator at a set target pressure but allows vaporized working fluid to escape through the exit port into a liquid-piston chamber whenever the target pressure is exceeded. A liquid-piston chamber coupled to the pressure-control valve receives the vaporized working fluid from the evaporator at the target pressure. The received vaporized working fluid expands adiabatically and displaces liquid within the liquid-piston chamber, expelling it therefrom in a pumping stage of a thermodynamic cycle. A unidirectional pump-exit check valve coupled to an exit port of the liquid-piston chamber allows the displaced liquid to exit the liquid-piston chamber.

A condenser is coupled to the pump-exit check valve to receive pumped liquid from the liquid-piston chamber (or pair of chambers) and is also coupled via a suction-entry check valve to a return port of the liquid-piston chamber, allowing the displaced liquid to return to the liquid-piston chamber in a suction stage of the thermodynamic cycle. A unidirectional liquid suction-entry check valve is coupled to a return port of the liquid-piston chamber.

A unidirectional vapor-injector return check valve is coupled to both an exit port of the liquid-piston chamber and to an input port of the fluid passageways of the evaporator, wherein periodic pressure pulses from the liquid-piston chamber that temporarily exceed the pressure in the evaporator facilitate jets of condensed fluid to return in successive brief spurts.

The pumping and suction stages repeat in multiple pump cycles, as activated by heat received from the motor.

A heating coil, responsive to a temperature sensor coupled to the motor, is in thermal communication with the motor and can be activated whenever the motor drops below some specified minimum operating temperature.

DETAILED DESCRIPTION

Nomenclature

Figure 1:
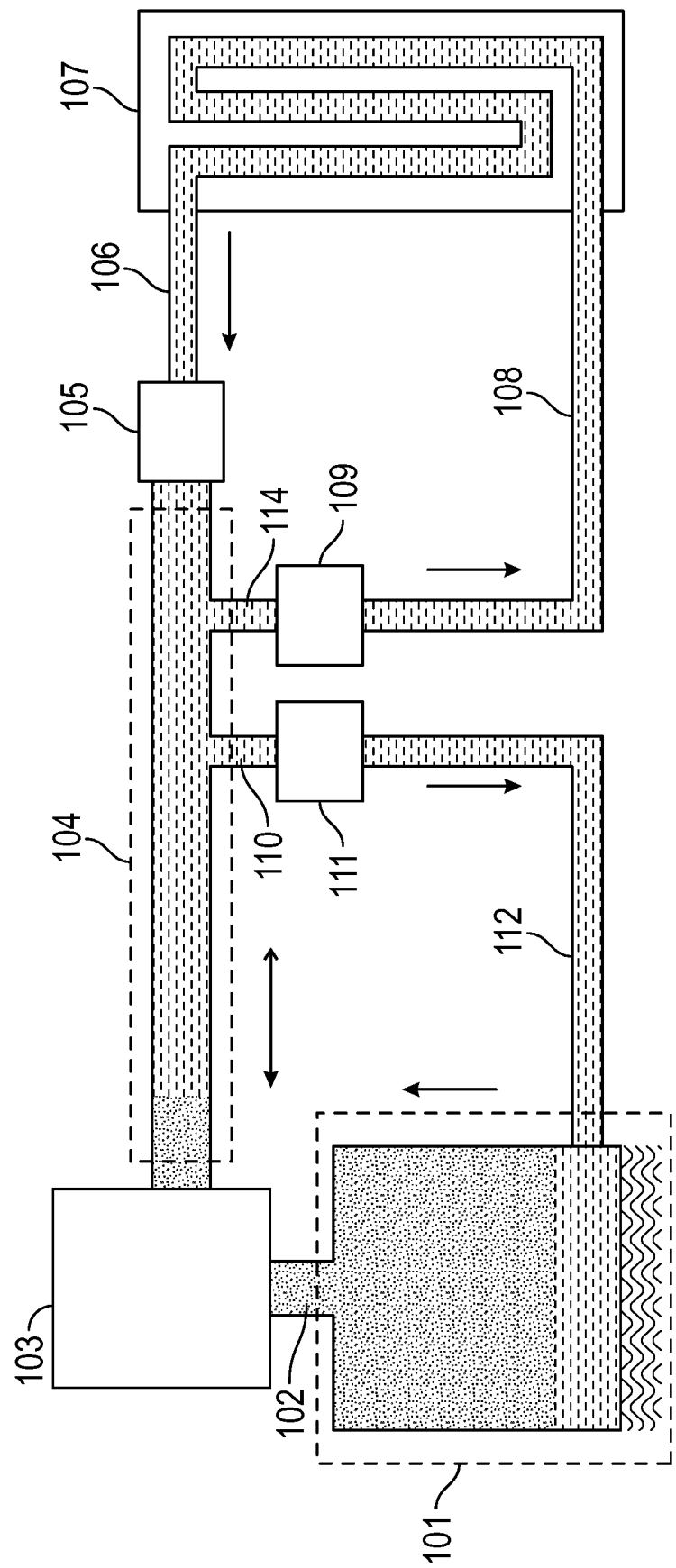
FIG. 1 is a schematic plan view of a heat-activated multiphase fluid-operated pump (HAMFOP) unit in accord with the present invention.

Working Fluid: The fluid whose change in phase is utilized to performing the pumping operation. The working fluid could be selected from a variety of fluid options: water, as well as commonly used or new refrigerants (e.g., R-130, R-245fa, R-407c, R-410a, R-454b, R-1234yf, etc.). In addition to performance and desired temperature range, safety (flammability and exposure limits) will be factors in the choice of working fluid.

Pumped Fluid: The fluid which is needs to be pumped from one location to another. This could be the same as the working fluid or it could be a different fluid altogether. If the pumped fluid is different, it would need to be immiscible with the working fluid.

Ambient Temperature: The temperature in the general environment around the region or device in focus.

The Heat-Activated Multiphase Fluid-Operated Pump

The HAMFOP pump utilizes heat to pump a fluid. The heat is used to convert a working fluid from liquid to vapor. The vapor is then used to displace the fluid that needs to be pumped.

The principle of operation is as follows, as referenced by the numbered elements in FIG. 1, assuming that both the working fluid and the pumped fluid are the same:

1. Heat is applied to the hot chamber or evaporator 101, which contains a small quantity of the working fluid in liquid form. As it is heated, the working fluid is transformed into vapor 102 at a high pressure based on the amount of heat applied and temperature of the hot chamber 101.
2. The pressurized vapor pushes against the base of the pressure control valve 103, which is counteracted by a deadweight or equivalent load applied on top of it. Once the pressure of the vapor 102 exceeds the deadweight load, the valve 103 opens and the vapor 102 enters a piston/suction chamber 104, which has a larger area. The larger area ensures that the force applied by the vapor 102 remains high enough to keep the valve 103 open until a desired amount of the vapor 102 exits the hot chamber 101. This operation is similar to the principle of operation of a typical safety valve.
3. When the vapor 102 enters the piston/suction chamber 104, which already contains the fluid 114 that needs to be pumped, the high-pressure vapor 102 rapidly expands and displaces the pump fluid 114 from the entry side of the piston chamber 104 towards an exit side (on the right in FIG. 2).
4. The rapid adiabatic expansion of the vapor 102 induces a periodic pressure pulse that flows through the pumped fluid 114 in the piston chamber 104. Since the pumped fluid 114 is incompressible, this temporarily raises the pressure in the piston chamber 104, while the pressure in the hot chamber 101 temporarily decreases due to the loss of the vapor 102. This creates a positive pressure differential between the piston chamber 104 and the hot chamber 101, which results in the opening of a return valve 111. Due to the pressure pulse generated by the rapid entry of the vapor 102 and the incompressibility of the pumped fluid 114, the pressure in the piston chamber 104 transiently rises to a value above the vapor entry pressure. The increased pressure in the piston chamber 104 causes the return valve 111 to open (acting like an injector). Some of the pumped working fluid 110 flows through the return valve 111 and enters via a replenishment passageway 112 back into the hot chamber 101 for re-heating. Once enough working fluid 110 has flowed into the hot chamber 101 to equilibrate the pressure, the return valve 111 closes. This operation is similar to the function that an injector performs in steam engines: high-pressure vapor is used to push a fluid into a high pressure and high temperature evaporator.
5. Since the piston chamber 104 now has slightly less fluid, the working vapor 102 continues to expand adiabatically and push against the pumped fluid 114. As the pressure in the piston chamber 104 continues to remain high, the pump exit valve 109 opens and lets out the fluid 114 via a passageway 108 into the condenser 107. This continues until the fluid 114 has been evacuated from the piston chamber 104 and the pressure in the piston chamber 104 reduces to a pressure close to that in the condenser 107.
6. Upon displacing the pumped fluid 114, the vapor 102 remaining in the piston chamber 104 expands into a larger volume, so it condenses, resulting in a reduction in pressure in the piston chamber 104, to a value below the pressure in the condenser 107. As a result, the pump valve 109 closes, completing the pump portion of the cycle and beginning a suction phase. The suction valve 105 now opens due to the negative differential pressure between the condenser 107 and the piston chamber 104, letting fresh working fluid 106 in. Due to the negative differential pressure, fluid 106 is drawn into the piston chamber 104 from the condenser 107.

7. While the pressure in the piston chamber 104 is below that of the condenser 107, the pressure control valve 103 remains closed to ensure no new vapor 102 enters the piston chamber 104 until the piston chamber pressure returns to above the condenser pressure, concluding the suction phase of the cycle.
8. Once the fluid in the piston chamber 104 has been replenished and the pressure is raised to the pressure of the condenser 107, the pressure control valve 103 re-opens, letting in vapor 102 to repeat the cycle.
9. In some embodiments, an electricity generator module may generate an electrical current induced in winding coils around the piston chamber during the continuous cyclic operation of the pump.

In the case where the pumped fluid 114 (and 106) is composed of a different material from the working fluid 102 (and 110), and not merely a different liquid-vapor phase of the same material, a difference in density between the working and pumped fluids can be leveraged to separate them. The elements of such an embodiment are largely identical to structure and operation to those in FIG. 1, except for the addition of a separator, in which the pumped fluid and the working fluid are separated. The pumped fluid 114 and 106 being of lower density would float to the top while the working fluid 102 and 110 would sink to the bottom. Accurate tuning (balancing the precise quantity of working and pumped fluid) would need to be performed to ensure that the separator chamber never ends up without any working fluid at all. If that were to happen, then some of the pumped fluid could enter the hot chamber 101, thus interrupting the cycle.

Battery Pack and Evaporator of Heat-Activated Pump

Figure 2:
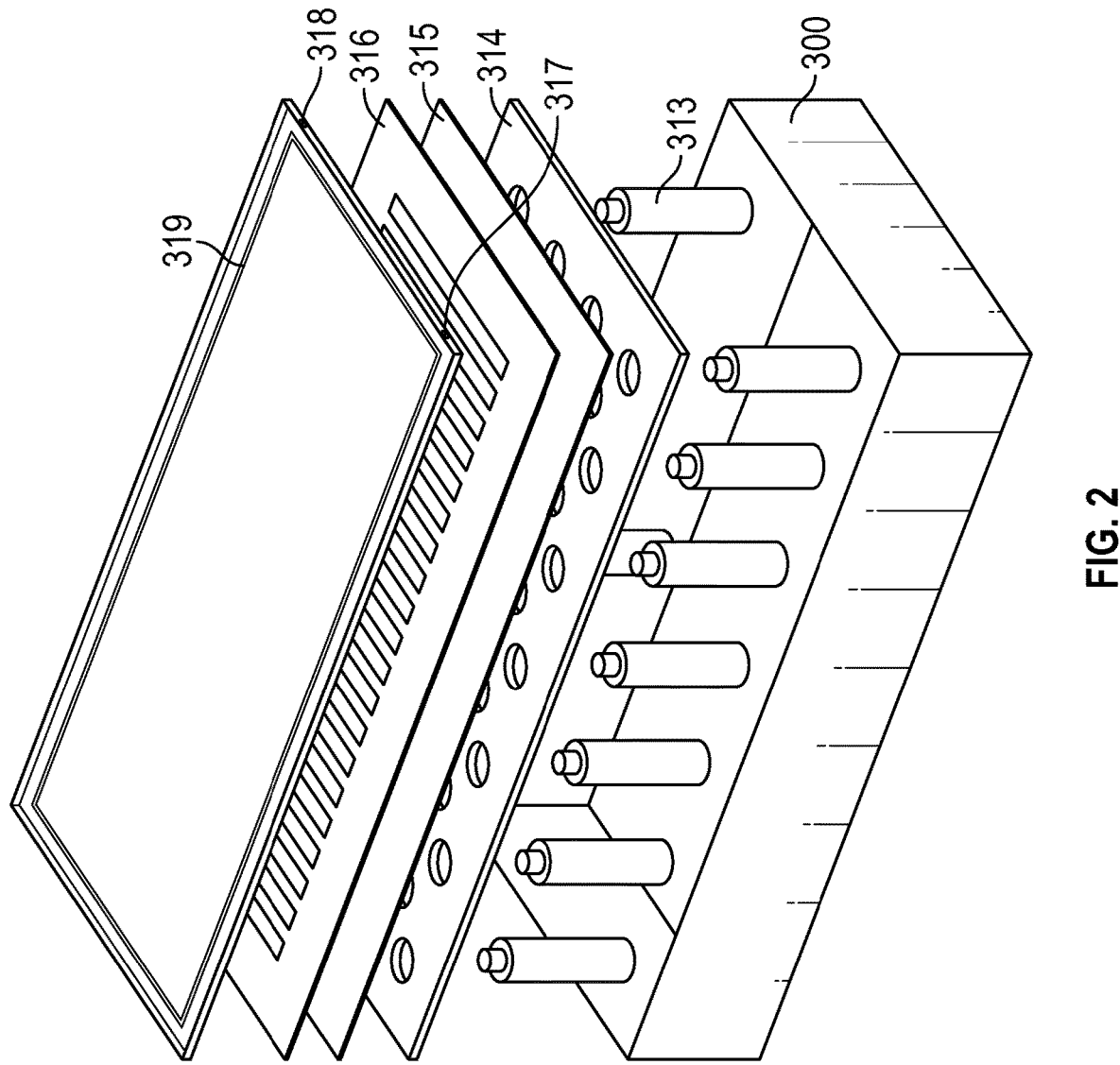
FIG. 2 is an exploded perspective view of a battery pack integrated with an evaporator for a HAMFOP unit as in FIG. 1.

With reference to FIG. 2, a battery pack with its individual battery cells 313 is integrated with a HAMFOP evaporator 316-319, where the cells 313 under direct mechanical contact with the cell tabs and their associated connector plate 314 work to vaporize the working fluid in the evaporator 316-319. A thermal interface material 315 between the connector plate 314 and the evaporator's bottom plate 316 helps to maximize heat transfer from the cell tabs to the working fluid. The cells 313 are encased in high thermal conductivity polymer material within a battery enclosure 300 to enhance surface cooling in addition to the tab cooling. The tab cooling could be optional or the surface cooling could be optional depending on the cooling needs of the system and the battery shape. The evaporator has top and bottom plates 316 and 319 with channels and/or ridges stamped therein for holding the working fluid and to maximize surface area for heat transfer. Fluid passageways in the evaporator can be serpentine or arranged in multiple parallel paths (as seen here). Vapor entry and exit ports 317 and 318 are formed at a perimeter of the evaporator 319 which will couple to valves of the HAMFOP. It should be noted that the HAMFOP pressure control valve and piston-suction chamber can also be made planar and integrated with the evaporator.

FIG. 2 shows the cathode tabs at the top of the battery cells 313 coupled to an evaporator 316-319. The anode tabs at the bottom of the battery cells 313 may be similarly coupled to a second identical evaporator. The two evaporators and the battery pack sandwiched in the middle would form a symmetrical structure providing double the cooling capacity of a single evaporator configuration.

Heat-Activated Pump for Battery Pack Cooling

Figure 3:
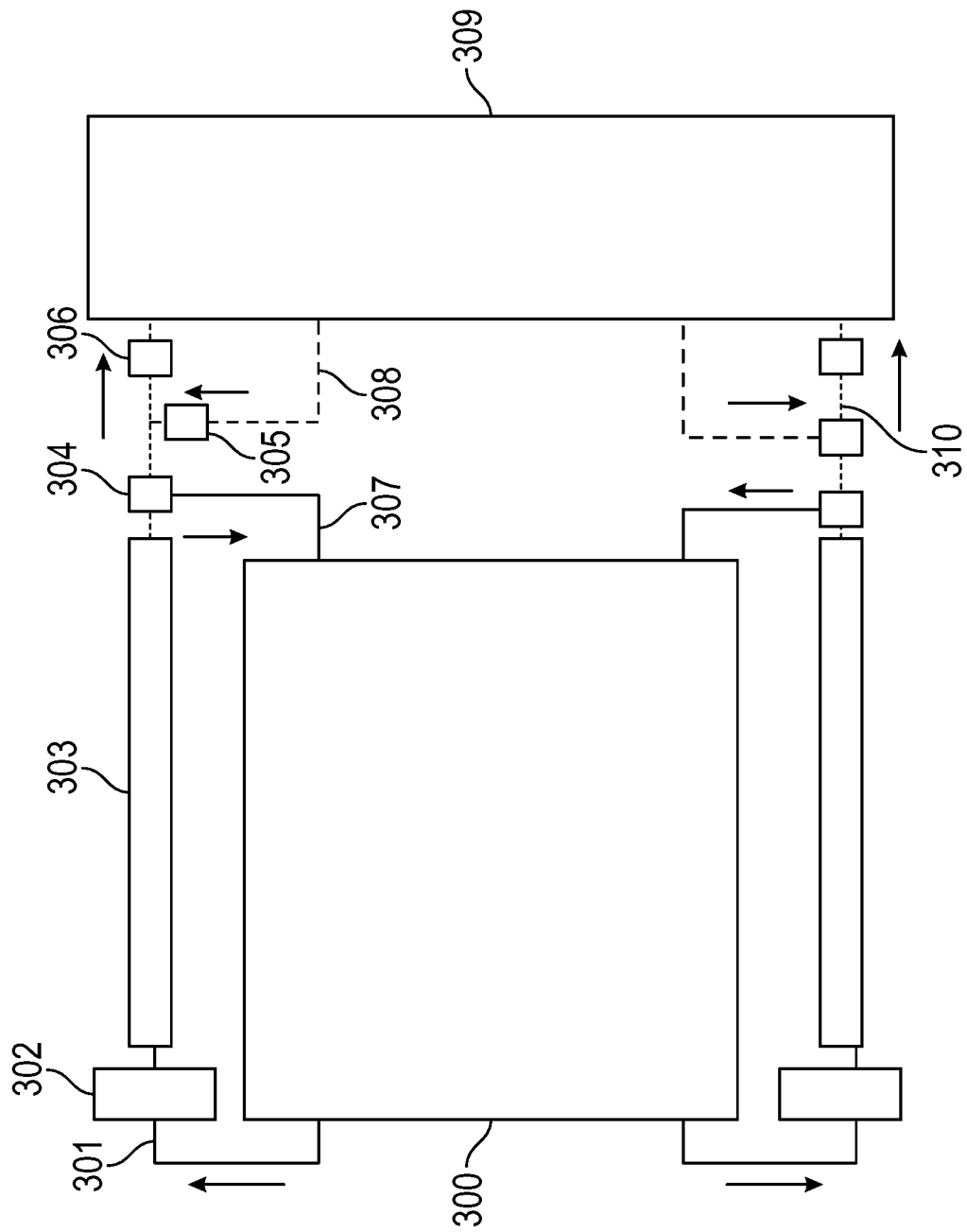
FIG. 3 is a schematic plan view of a HAMFOP unit as in FIG. 1 adapted for cooling a battery pack.

With reference to FIG. 3, a battery enclosure 300 holding individual battery cells is integrated with evaporators as in FIG. 2 is seen here with two heat-activated pumps, one coupled to the cathode tabs of the battery cells and a second coupled to anode tabs of the battery cells. Working fluid heated to a vapor in the evaporator integrated with the battery pack 300 passes from fluid passageway exit ports 301 of the evaporators through corresponding pressure control valves 302 to piston-suction chambers 303. Unidirectional vapor-injector return check valves 304 and corresponding return lines 307 send working fluid back to the evaporator in successive brief spurts responsive to periodic pressure pulses in the piston-suction chambers 303. Uni-directional pump-exit check valves 306 couple via a pump line 310 to a common condenser/radiator 309, after which pumped fluid is returned via suction line 308 and unidirectional liquid suction-entry check valves 305 to the respective piston-suction chambers 303. The operation of each of two HAMFOP units (with common condenser/radiator 309) is as described above in reference to FIG. 1.

Heat-Activated Pump for Battery Pack Heating

Figure 4:
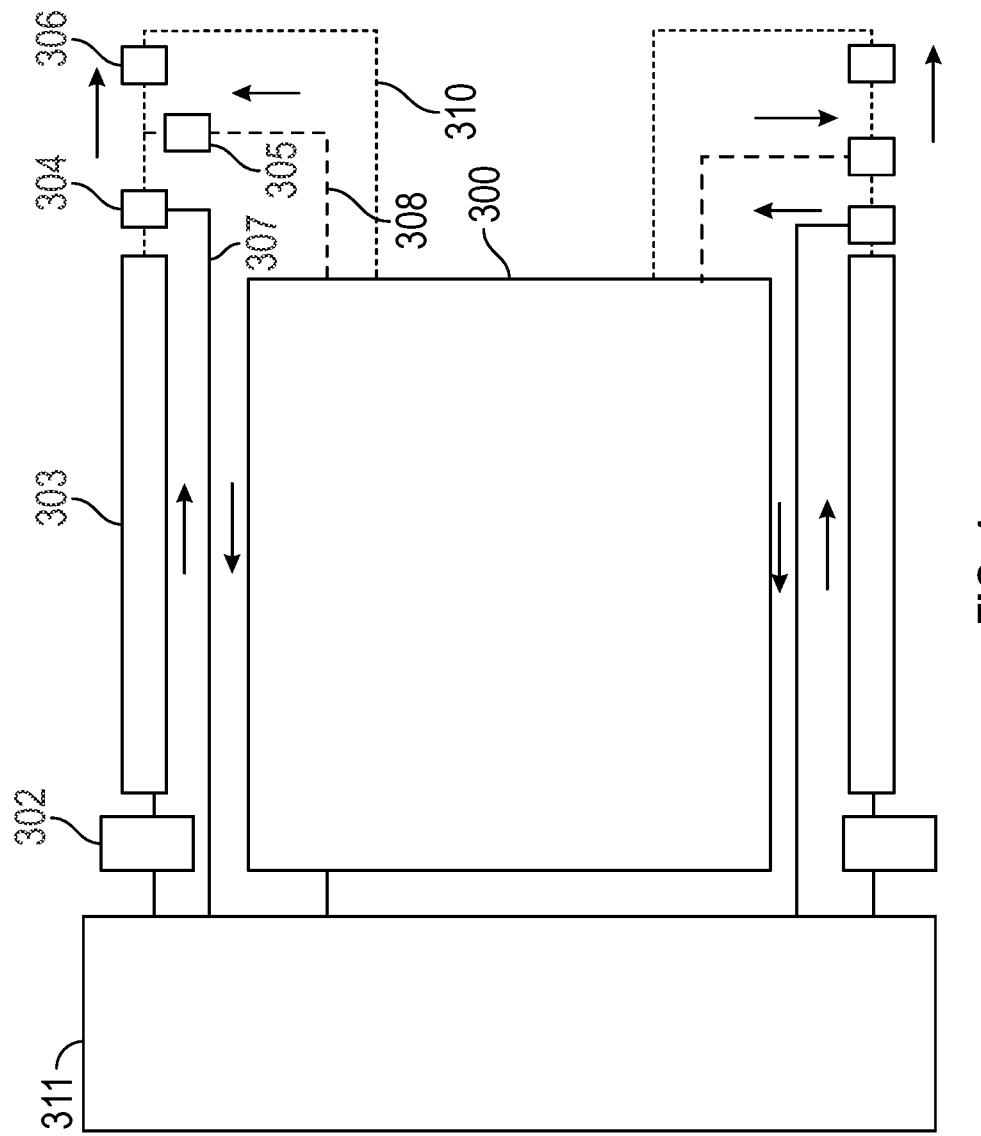
FIG. 4 is a schematic plan view of a HAMFOP unit as in FIG. 1 adapted for heating a battery pack.

With reference to FIG. 4, the HAMFOP unit of FIG. 1 can also be employed to perform the reverse operation, namely heating a battery pack in cold temperatures. In that case, the battery enclosure 300 would be associated with and coupled via its battery cell tabs or surface to a condenser, while the evaporator would be part of a heating unit 311. The heater 311 could be a stalled motor or an electric resistive element or other method to generate the heat. Passageways in the heater 311 vaporize the working fluid that passes through corresponding pressure control valves 302 to piston-suction chambers 303. Uni-directional vapor-injector return check valves 304 and corresponding return lines 307 send working fluid back to the heater 311 in successive brief spurts responsive to periodic pressure pulses in the piston-suction chambers 303. Uni-directional pump-exit check valves 306 couple via a pump line 310 to the battery enclosure 300, serving as a radiator, to heat the battery cells via respective cathode and anode tabs or battery body. After this, the pumped fluid is returned via suction line 308 and unidirectional liquid suction-entry check valves 305 to the respective piston-suction chambers 303. The operation of each of two HAMFOP units (with common heater 311 and common battery enclosure/radiator 300) is again as described above in reference to FIG. 1.

Both the battery cooling and heating systems (FIGS. 3 and 4) can be used together to deliver cooling or heating as needed, depending on ambient temperature and battery load. Such a dual system can be operated with a temperature sensor that monitors the temperature of the battery enclosure 300. If the ambient temperature drops below the minimum operating temperature allowed for that battery, the heating system of FIG. 4 is activated. If the battery pack gets too warm and exceeds a maximum operating temperature, then the cooling system of FIG. 3 is activated.

Heat-Activated Pump for Electric Motor Cooling

Figure 5:
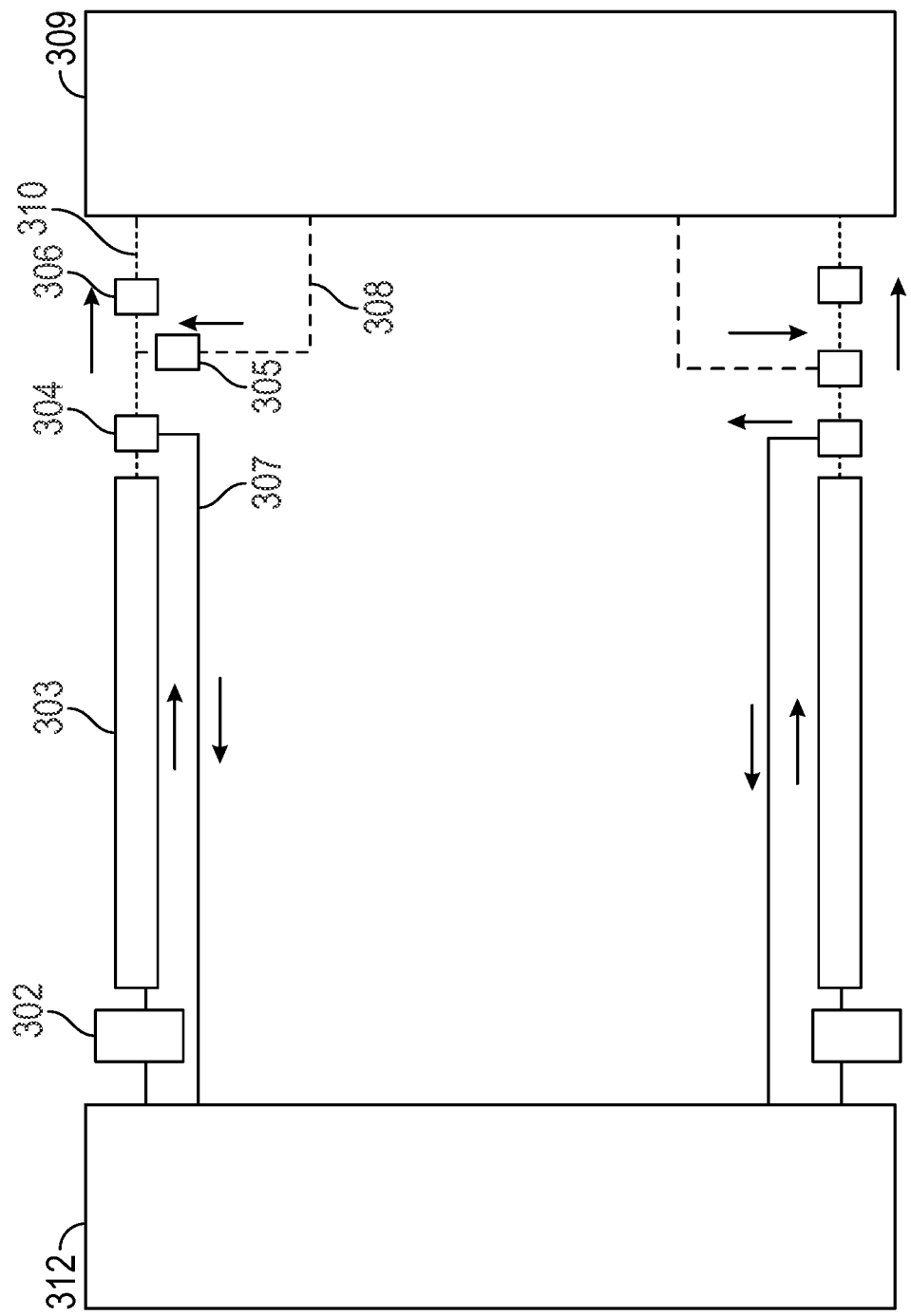
FIG. 5 is a schematic plan view of a HAMFOP unit as in FIG. 1 adapted for cooling an electric motor.

With reference to FIG. 5, the HAMFOP unit can be used not only to control battery pack temperature but also cool electric motors, as needed, to remove waste heat generated by such motors. An electric motor 312 has an evaporator integrated with it, such as by flexible tubing surrounding the motor casing or fluid channels integrated into the motor casing and/or body. The tubing contains working fluid that is receptive of the waste heat from the electric motor and vaporizes. As seen in FIG. 5, the HAMFOP unit may be multiplied (two units are shown here) according to the desired heat removal capacity. As in the other units described above, the working fluid from the evaporator integrated with electric motor 312 passes through pressure control valves into corresponding piston-suction chambers 303. Uni-directional vapor-injector return check valves 304 and corresponding return lines 307 send working fluid back to the evaporator 312 in successive brief spurts responsive to periodic pressure pulses in the piston-suction chambers 303. Uni-directional pump-exit check valves 306 couple via pump lines 310 to a common condenser/radiator 309, after which pumped fluid is returned via suction lines 308 and unidirectional liquid suction-entry check valves 305 to the respective piston-suction chambers 303.

The operation of each of HAMFOP unit (with common condenser/radiator 309) is again as described above in reference to FIG. 1. As with the battery application, the motor temperature could be heated or cooled depending on the end use application and the target ambient temperature in which the motor is operated.

What is claimed is:

1. A heat-activated pump for temperature regulation of a motor, comprising:
   an evaporator having one or more fluid passageways in thermal contact with heat generating elements of the motor, the passageways containing a working fluid and receptive of heat from the motor to convert the working fluid into vapor;
   a pressure-control valve coupled to an exit port of the fluid passageways of the evaporator and maintaining the working fluid in the evaporator at a set target pressure and allowing vaporized working fluid to escape through the exit port whenever the target pressure is exceeded;
   a liquid-piston chamber coupled to the pressure-control valve to receive vaporized working fluid from the evaporator at the target pressure, the vaporized working fluid expanding adiabatically and displacing liquid within the liquid-piston chamber, expelling it therefrom in a pumping stage of a thermodynamic cycle;
   a unidirectional pump-exit check valve coupled to an exit port of the liquid-piston chamber to allow the displaced liquid to exit the liquid-piston chamber;
   a unidirectional liquid suction-entry check valve coupled to a return port of the liquid-piston chamber;
   a condenser coupled to the pump-exit and suction-entry check valves to receive displaced liquid and allow it to return to the liquid-piston chamber in a suction stage of the thermodynamic cycle; and
   a unidirectional vapor-injector return check valve coupled to both an exit port of the liquid-piston chamber and to an input port of the fluid passageways of the evaporator, wherein periodic pressure pulses from the liquid-piston chamber that temporarily exceed the pressure in the evaporator facilitate jets of condensed fluid to return in successive brief spurts.

2. The heat-activated pump as in claim 1, wherein the motor is an electric motor.

3. The heat-activated pump as in claim 2, wherein the one or more fluid passageways of the evaporator comprise flexible tubing surrounding a motor casing.

4. The heat-activated pump as in claim 2, wherein the one or more fluid passageways of the evaporator are integrated into a motor casing.

5. A heat-activated pump as in claim 1, wherein the liquid in the liquid-piston chamber is the same material as the working fluid.

6. A heat-activated pump as in claim 1, wherein the liquid in the liquid-piston chamber is a different immiscible material of different density from the working fluid, the pump further comprising a separator coupled between the liquid-piston chamber and the exit ports thereof to direct the working fluid to the vapor-injector return check valve leading back to the evaporator and the displaced liquid to the pump-exit check valve leading to the condenser.

7. A heat-activated pump as in claim 1, further comprising a temperature sensor coupled to the motor, and a heating coil in thermal communication with the motor and responsive to the temperature sensor to be activated whenever the motor drops below a minimum operating temperature.

\* \* \* \* \*